United States Patent [19]
Kelber

[11] Patent Number: 6,114,032
[45] Date of Patent: Sep. 5, 2000

[54] FILMS FOR USE IN MICROELECTRONIC DEVICES AND METHODS OF PRODUCING SAME

[75] Inventor: Jeffry A. Kelber, Plano, Tex.

[73] Assignee: The University of North Texas, Denton, Tex.

[21] Appl. No.: 09/058,474

[22] Filed: Apr. 10, 1998

[51] Int. Cl.[7] .................................................. B32B 7/12
[52] U.S. Cl. ..................... 428/336; 427/509; 427/515; 428/446; 428/447; 428/450
[58] Field of Search ..................... 427/509, 515; 428/333, 336, 446, 447, 450

[56] References Cited

U.S. PATENT DOCUMENTS

| | | | |
|---|---|---|---|
| 4,588,609 | 5/1986 | Leyden et al. ........................... | 427/54.1 |
| 4,925,612 | 5/1990 | Waragai et al. .......................... | 264/164 |
| 5,164,332 | 11/1992 | Kumar ..................................... | 437/198 |
| 5,187,639 | 2/1993 | Ogawa et al. ........................... | 361/323 |
| 5,288,528 | 2/1994 | Blanchet-Fincher ..................... | 427/596 |

OTHER PUBLICATIONS

Imahori, J. et al., "Diffusion barrier properties of TaC between Si and Cu," *Thin Solid Films*, 301 142–148 (1997).

Helmann, D. et al., "Epitaxial growth of β–SIC thin finlsm on a 6H–SIC substrate using the chemical solution deposition method," *Journal of Maaterials Research, Abstracts for Nov. 1997*, vol. 12, No. 11, p. 60.

Bozso, F. et al., "Studies of SiC formation on Si(100) by chemical vapor deposition," *J. Appl. Phys.* 57(8), Apr. 15, 1985, pp. 2771–2778.

Taylor, P.A., et al., "X–ray photoelectron spectroscopy study of Si–C film growth by chem vapor desposition of ethylene on Si(100),"*J. Appl. Phys.* 65(3), Feb. 1, 1989.

Tillman, Nolan, et al., "Formation of Multilayers of Self–Assembly," *American Chemical Society, Langmuir*, pp. 101–111 vol. 5, No. 1, 1989.

Wasserman, Stephen R., "Structure and Reactivity of Alkylsiloxane Monolayers Formed by Reaction of Alkyltrichlorosilanes on Silicon Substrates," *American Chemical Society*, pp. 1074–1989.

Wiegand, B.C., et al., "Si–H Bond Activation on Cu: Reaction of Silane on Cu(111)," *J. Phys. Chem.*97, pp. 11553–11562, 1993.

Tao, Y.–T., "Structural Comparison of Self–Assembled Monolayers of n–Alkanoic Acids on the Surfaces of Silver, Copper, and Aluminum," *J. Phys. Chem.*115, pp. 4350–4358, 1993.

Lenhart, S.J., et al., "The Corrosion Resistance of an Aluminum Alloy Coated with Polysilazane–Derived Ceramics," *Science*, vol. 45, No. 6, 1989.

Kurth, D.G., et al., "Monomolecular Layers and Thin Films of Silane Coupling Agents by Vapor–Phase Adsorption on Oxidized Aluminum," *J. Phys. Chem.*96, pp. 6707–6712, 1992.

Gates, S.M., "Decomposition mechanisms of SiHx species on Si(100)—(2x1) for x=2, 3, and 4," *J. Phys. Chem.*93, pp. 7493–7503, 1990.

Dubois, L.H., et al., "The adsorption and thermal decomposition of trimethylamine alane on aluminum and silicon sinle crystal surfaces: kinetic and mechanistic studies," *Surface Science* 236 pp.77–84, 1990.

Curson, N.J., et al., "Interaction of silane with Cu(111): Surface alloy and molecular chemisorbed phases," *The American Physical Society, Physical Review B*, vol. 55, No. 16, pp. 10819–10829, 1997.

Bent, B.E., et al., "Surface organometallic Chemistry in the Chemical Vapor Deposition of Aluminum Films Using Triisobutylaluminum:β–Hydride and β–Alkyl Elimination Reactions of Surface Alkyl Intermediates," *J. Am. Chem. Soc.*111, pp. 1634–1644, 1989.

*Primary Examiner*—D. S. Nakarani
*Attorney, Agent, or Firm*—Townsend and Townsend and Crew LLP

[57] ABSTRACT

The present invention provides thin films for use in microelectronic devices. In one aspect, the present invention provides a copper diffusion barrier. In another aspect, the present invention provides a polymer film for various applications including use as a dielectric insulator and surface modification layers. Methods for the production of the films are also disclosed.

11 Claims, 3 Drawing Sheets

FILMS FOR USE IN MICROELECTRONIC DEVICES AND METHODS OF PRODUCING SAME

BACKGROUND OF THE INVENTION

The present invention relates generally to the field of electronic and microelectronic devices, and more particularly relates to polymeric films for use in electronic and microelectronic devices, and to methods for their production.

Many varieties of polymeric films have been employed in the electronics and microelectronics industries. As industry-wide pressure increases to produce smaller and smaller electronics components, the fabrication of ultra-thin films for electronics applications becomes increasingly important. In the past, polymeric films have been employed in microelectronics applications as insulating materials, resist films, gas separation membranes, diffusion barriers, corrosion barriers, surface modification or surface sealing of porous substrates, lubricating layers for small scale machining operations (e.g., nanomachining applications) and others. Metal and metal alloy films have also been employed for these applications.

As demand increases for new wiring and electronic component materials, and as a result of the attractive qualities of copper for wiring and electronic components, the need for efficient diffusion barriers to copper rises. Copper's low electrical resistivity and high resistance to electron migration yield improved device reliability in devices which employ copper. However, copper diffusion into silicon and silica substrates at elevated temperatures can lead to device degradation. Attempts to develop efficient copper diffusion barriers for these applications have led to a number of metal film materials. J. Imahori, et al., *Thin Solid Films* 301:142 (1997) lists several metal and metal alloy films including TaC, W, Ta, Ta—Si, W—N, Ta—N, Ti—N, Ti—Si—N, and Ta—Si—N films which have been investigated for use as copper diffusion barriers. In addition, U.S. Pat. No. 5,164,332 to Kumar proposes a copper metal alloy as a copper diffusion barrier between a copper feature and an oxygen-containing polymer. The diffusion barrier is formed by coating a metal (e.g., Al) on the copper feature and heating the metal and copper to form an alloy. To be effective, materials employed as copper diffusion barriers should exhibit low thermal coefficient of expansion, ease of processing, good adhesion to copper, and minimal reactivity with copper and other microelectronics materials. Often, particularly preferred copper diffusion barriers also exhibit a low dielectric constant as well.

In addition to the need for copper diffusion barriers, there also remains a need in the art for thin films which can be useful as insulating materials, resist films, lubricating layer materials, and surface modification and sealing materials. Many varieties of dielectric or insulating materials have been employed in microelectronics devices. Silicon dioxide, silicon nitride, polyimides, and polyphenylene polymers are examples of materials which have been proposed for these applications. For example, U.S. Pat. No. 4,588,609 proposes one method of preparing polyparaphenylene polymer films by photochemical vapor deposition. These materials can be difficult to fabricate and process, and producing the necessary thin layers of these materials for use in microelectronics has been challenging.

There remains a need in the art for effective copper diffusion barriers and insulating materials. There further remains a need in the art for copper diffusion barriers which prevent the diffusion of copper atoms or ions at elevated temperatures. In addition, there remains a need in the art for copper diffusion barriers which can be fabricated as ultrathin films. There also remains a need in the art for methods of producing polymer films for use in microelectronics applications. In one aspect, the present invention provides a copper diffusion barrier for use in electronics and microelectronics applications. The present invention also provides a method for producing thin polymer films on substrates for use in electronic, particularly microelectronic, devices.

SUMMARY OF THE INVENTION

As a first aspect, the present invention provides a copper diffusion barrier for a microelectronic device comprising a copper feature. The copper diffusion barrier comprises a crosslinked carbon-silicon polymer film having a thickness sufficient to attenuate the diffusion of copper atoms and copper ions from the copper feature.

As a second aspect, the present invention provides a microelectronic device comprising a copper feature and a copper diffusion barrier on a substrate. The copper diffusion barrier includes a crosslinked carbon-silicon polymer film, and prevents the diffusion of copper atoms and copper ions from the copper feature at temperatures of up to about 750 K.

As a third aspect, the present invention provides a method for producing a polymer film covalently bonded to a substrate. The method includes the steps of: a) adsorbing a plurality of vinyl silane monomers on the substrate; b) contacting the adsorbed vinyl silane monomers with gaseous polymerizable monomers selected from the group consisting of unsaturated hydrocarbon monomers, unsaturated halo-substituted hydrocarbon monomers, and combinations thereof; and c) polymerizing the polymerizable monomers on the adsorbed vinyl silane monomers. The polymerization of the polymerizable monomers produces the polymer film covalently bound to the substrate through the vinyl silane monomers.

As a fourth aspect, the present invention provides a microelectronic device including a substrate and a thin polymer film covalently bound thereto. The thin polymer film is covalently bound to the substrate through vinyl silane monomers.

These and other aspects of the present invention are described further in the detailed description and examples of the invention which follow.

DESCRIPTION OF THE PREFERRED EMBODIMENT

Figure 1:
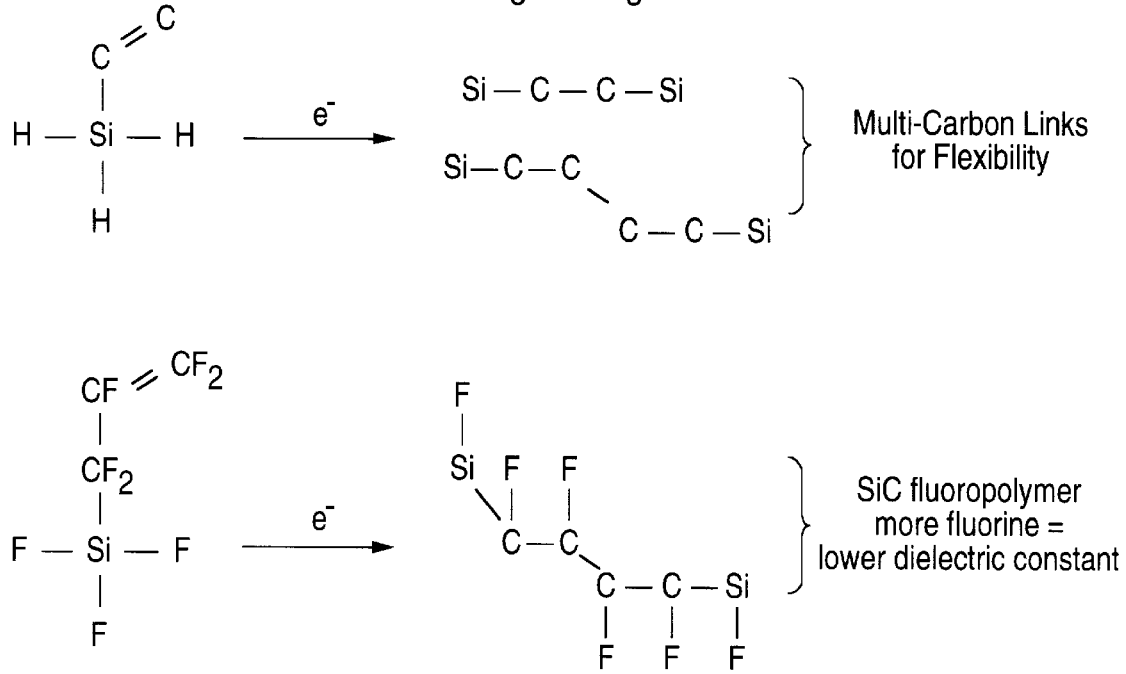
FIG. 1 is a demonstrates that different properties can be attributed to the crosslinked carbon-silicon polymer film by utilizing different vinyl silane monomers. Utilizing vinyl silane monomers having multiple carbon links provides increased elasticity and flexibility in the crosslinked carbon-silicon polymer film. Using flourinated vinyl silane monomers produces a film having a lower dielectric constant.
Figure 2:
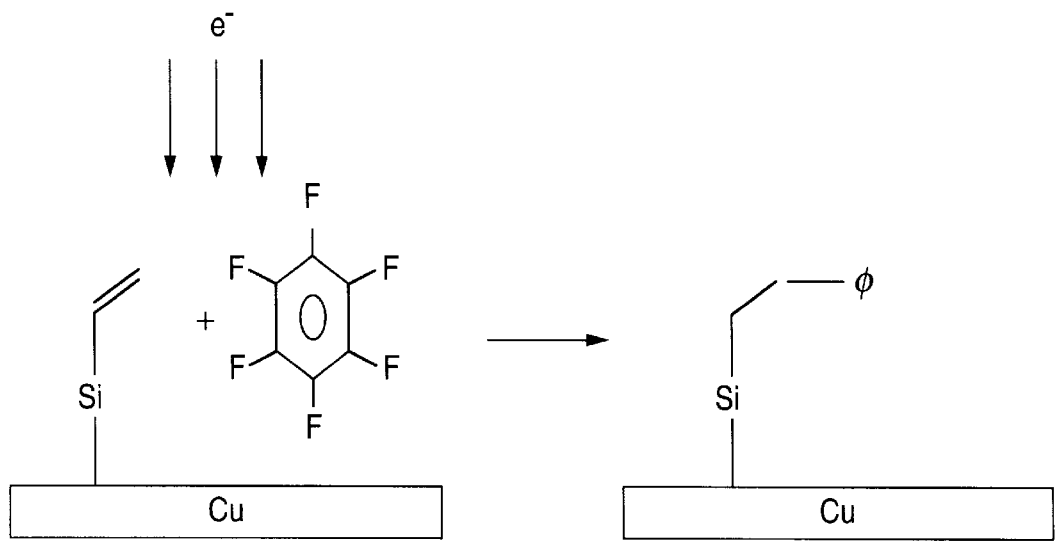
FIG. 2 is a depiction of the electron-beam incorporation of $C_6F_6$ into a vinyl silane adlayer on a copper substrate.
Figure 3:
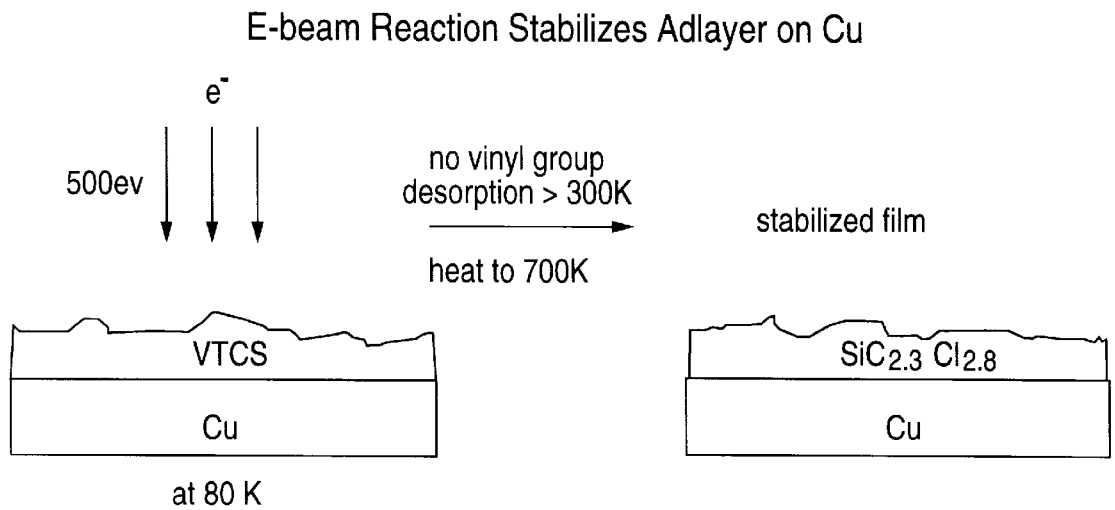
FIG. 3 shows the electron-beam stabilization of the crosslinked carbon-silicon polymer layer on a copper substrate.
Figure 4:
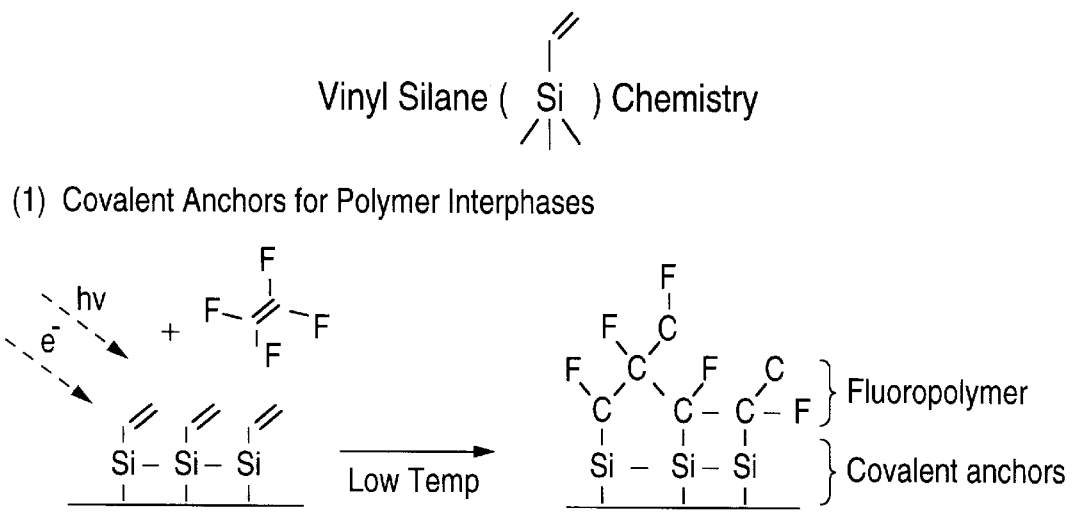
FIG. 4 is a depiction of the vinyl silane chemistry of the present invention. The first reaction demonstrates the formation of covalent anchors for polymer interphases using the methods of the present invention. The second reaction demonstrates the formation of copper diffusion barriers using the methods of the present invention.
Figure 4:
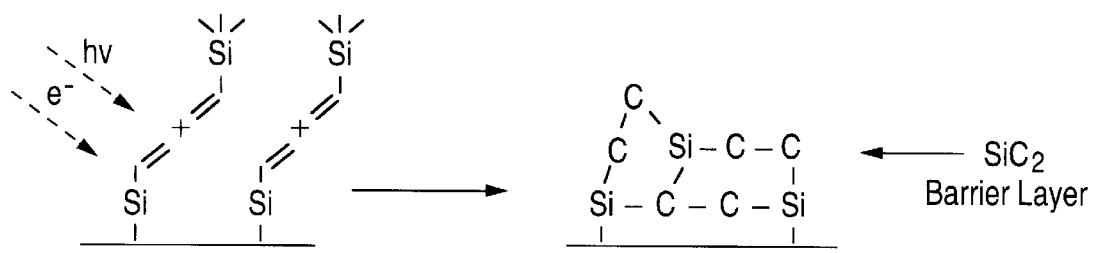
Figure 5:
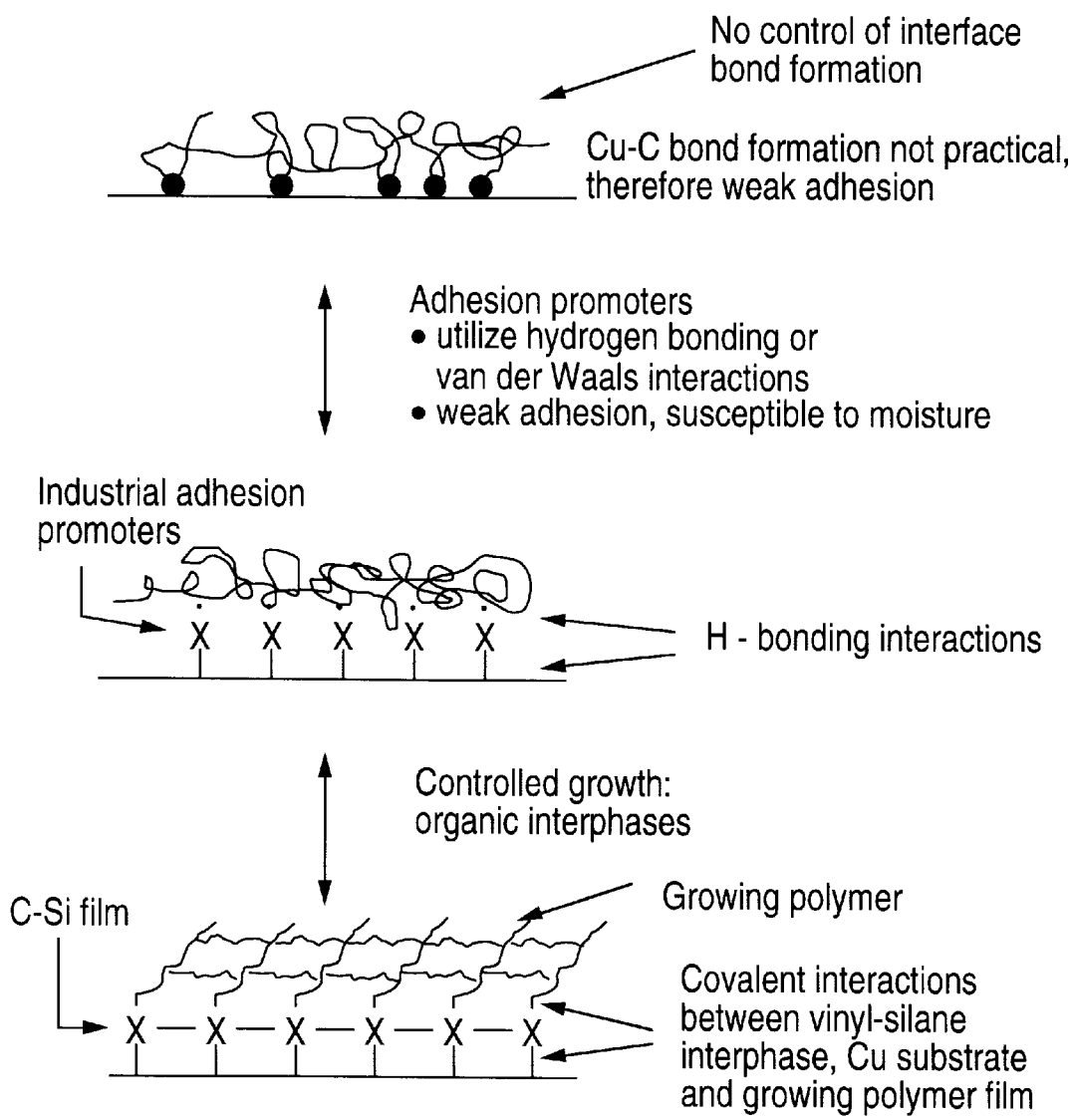
FIG. 5 is a comparison of the properties of polymers bound by varying means, to metal surfaces. The first drawing shows that when no control of the interface bond formation between the surface and the polymer is employed, the copper-carbon formation is not practical and therefore results in weak adhesion of the polymer. In the second drawing, adhesion promoters are employed which utilize hydrogen bonding or van der Waals interactions to bond the polymer to the metal substrate surface. The result is again weak adhesion which is susceptible to moisture. The last drawing represents the innovation of the present invention whereby the polymer is bound to the substrate by controlled growth organic interphases. The interactions between the vinyl-silane interphase and the metal substrate surface and growing polymer film, are covalent interactions, which provide substantially more stable adhesion of the polymer to the surface of the substrate.

Generally the terms employed herein have the meanings generally ascribed to them in the art unless otherwise specified. The following terms have the meanings specifically set forth below.

The term "monomer" refers to small molecules which are or can be joined together to form a polymer composed of two or more monomeric units. "Vinyl silane monomers" are a specific type of monomer including at least one silane atom and one or more vinyl groups within a single monomer. As used herein, the term "vinyl group" refers to a group within a molecule which is composed of two carbon atoms joined by either a double or triple bond. Vinyl silane monomers typically include monomers having between 2 and 16 carbon atoms, at least one silicon atom, and one or more ethylenically unsaturated bonds, i.e., one or more double or triple bonds.

The term "carbon-silicon polymer" refers to a polymer containing carbon and silicon and optionally other moieties. The term does not imply any specific ratio of carbon to silicon. The polymer may contain any ratio of carbon to silicon.

The term "$C_1$–$C_8$ hydrocarbyl radical" refers to a functional group of a molecule which is composed of primarily carbon and hydrogen and includes from 1 to 8 carbon atoms. An "unsaturated $C_1$–$C_8$ hydrocarbyl radical" is a $C_1$–$C_8$ hydrocarbyl radical including one or more double bonds, or one or more triple bonds. Examples of unsaturated $C_1$–$C_8$ hydrocarbyl radicals include but are not limited to —CH=CH$_2$, —CH$_2$CH=CH$_2$, —CH=CHCH=CH$_2$, and the like.

The term "alkyl" refers to saturated $C_1$–$C_8$ hydrocarbyl radicals, which may be straight chain, branched or cyclic. As used herein, the term alkyl also refers to substituted alkyl groups which are substituted with functional groups including, for example a halogen. Specific examples of alkyl groups within the scope of the present invention include but are not limited to methyl, ethyl, propyl, isopropyl, n-butyl, t-butyl, pentyl, hexyl, cyclohexyl, octyl, and the like.

The term "alkoxyl" refers to saturated $C_1$–$C_8$ oxo-hydrocarbyl radicals, which may be straight chain, branched or cyclic. As used herein, the term alkoxyl also refers to substituted alkoxyl groups which are substituted with functional groups including, for example a halogen. Specific examples of alkoxyl groups within the scope of the present invention include but are not limited to methoxyl, ethoxyl, propoxyl, isopropoxyl, n-butoxyl, t-butoxyl, and the like.

The term "halo" or "halogen" refers to fluorine, chlorine, bromine, iodine, or a group in a molecule which is composed of any of the foregoing atoms (i.e., a halide group).

The term "polymerizable monomer" refers to hydrocarbon monomers which can be polymerized to form polymers. In the present invention, the polymerizable monomers typically do not contain silicon, but may contain oxygen, nitrogen, sulfur, halogens, or other non-carbon atoms. "Unsaturated hydrocarbon monomers" are polymerizable hydrocarbon monomers which include one or more double bonds, or one or more triple bonds. Examples of unsaturated hydrocarbon monomers include but are not limited to ethylene, acetylene, benzene, toluene, styrene, and the like. Polymerizable monomers also include halo-substituted hydrocarbon monomers. Examples of unsaturated halo-substituted hydrocarbon monomers include perfluoroethylene, perfluorobenzene, and perfluorobutadiene, and chlorinated analogs thereof. "VTCS" means vinyltrichlorosilane.

A. Crosslinked Carbon-Silicon Polymer Films as Copper Diffusion Barriers

The present invention provides different types of films which can be used in electronics or microelectronics applications. One film according to the present invention is useful as a copper diffusion barrier. The copper diffusion barrier according to the present invention comprises a crosslinked carbon-silicon polymer film having a thickness sufficient to attenuate the diffusion of copper atoms and copper ions from a copper feature in a microelectronic structure. The copper feature can be any electronic component comprised of copper, including a copper substrate, copper wire, copper surface, or the like.

Generally, the crosslinked carbon-silicon polymer film is produced by a process which includes the steps of a) adsorbing a plurality of vinyl silane monomers on the surface of a substrate, and b) exposing at least a portion of the adsorbed vinyl silane monomers to radiation, whereby the vinyl silane monomers are crosslinked to produce the crosslinked carbon-silicon polymer film. The substrate on which the crosslinked carbon-silicon polymer film is produced can be composed of any material suitable for use in microelectronic or electronic devices. Typical substrates include but are not limited to copper substrates, silicon substrates, silica substrates, aluminum substrates, alumina substrates, tungsten substrates, tantalum substrates, titanium nitride substrates, tantalum nitride substrates, and titanium tungsten alloy substrates. Copper, aluminum, alumina, silicon and silica substrates are currently the more commonly employed substrates for the production of the crosslinked carbon-silicon polymer films of the present invention. However, the other substrates listed above are equally useful for the production of the crosslinked carbon-silicon polymer films according to the present invention.

In the first step of the method, a plurality of vinyl silane monomers are adsorbed onto a surface of the substrate. When crosslinked, the vinyl silane monomers form the crosslinked carbon-silicon polymer film. The vinyl silane monomers which can be employed to produce the copper diffusion barrier are defined generally above. More specifically, the suitable vinyl silane monomers will have the general formula:

wherein R is selected from the group consisting of unsaturated $C_1$–$C_8$ hydrocarbyl radicals and unsaturated halo-substituted $C_1$–$C_8$ hydrocarbyl radicals and X is selected from the group consisting of H, halo, $C_1$–$C_8$ alkyl, and $C_1$–$C_8$ alkoxyl groups.

The use of unsaturated halo-substituted vinyl silane monomers in the methods of the present invention provides further advantages in applications involving dielectric materials. In the fabrication of circuits on microelectronics devices, a dielectric is used to separate the metal lines (Al or, more recently, Cu) which carry electrical signals. The higher the dielectric constant of the dielectric material, the longer the signal processing time (due to RC time delay), and the higher the electrical "cross-talk" between electronic signals on adjacent metal lines. Signal processing time and electrical "cross-talk" limit computing speed and severely limit the compactness of the device. By lowering the dielectric constant, increased signal processing speeds and smaller device size are made possible. Fluorinated carbon-silicon polymer films have dielectric constants below 2.5 (relative to air), and thus have advantages over the conventional $SiO_2$ dielectric material, which has a dielectric constant of 3.8–4.0. In general, the higher the fluorine content of the fluroinated carbon-silicon polymer film, the lower the dielectric constant. In the past, fluoropolymers were not believed to be suitable dielectric materials because some fluoropolymers (e.g., TEFLON®) may not stick well to other surfaces employed in the microelectronic device. The use of the crosslinked carbon-silicon polymer films according to the present invention, increases the adhesion of the polymer films to Si and Cu substrates (thereby preventing diffusion of Cu into Si) leading to smaller and faster microchips.

Currently preferred vinyl silane monomers include vinyl silane monomers defined where R is ethene or propene and X is selected from the group consisting of H, Cl, F, methyl, or methoxyl. Another group of currently preferred monomers include vinyl silane monomers defined where R is perfluoroethene and X is H, Cl, F, methyl, or methoxyl. Vinyl trichlorosilane is one preferred vinyl silane monomer for use in the methods of the present invention. Other suitable vinyl silane monomers for use in the methods of the present invention will be readily determinable by those skilled in the art based upon the foregoing general formula.

The present invention provides the further advantage that two or more different vinyl silane monomers may be crosslinked to provide the crosslinked carbon-silicon polymer film. By utilizing mixtures of different vinyl silane monomers, it is possible to control the silicon content of the resulting crosslinked carbon-silicon polymer and to thereby control the properties which will be exhibited by the resultant polymer. Crosslinked carbon-silicon polymer films including less silicon are desirable for coating polymers and other materials with large coefficients of thermal expansion; whereas for protecting Si, $SiO_2$ or other metal oxides, and similar applications it may be desirable to utilize a combination of vinyl silane monomers which will produce a polymer containing more silicon.

The vinyl silane monomers are adsorbed to the surface of the substrate by contacting gaseous vinyl silane monomers with the surface of the substrate for a period of time sufficient to permit the bonding of the silyl moieties of the vinyl silane monomers to the surface of the substrate. Any suitable method of contacting the gaseous monomers to the substrate may be employed. For example, the gaseous vinyl silane monomers may be contacted with the surface of the substrate by loading the gaseous monomers into a vessel having a leak valve and directional doser, achieving and maintaining a constant pressure in the vessel, and placing the substrate in front of the directional doser. Typically, the substrate is cooled to about 80 K prior to dosing. The period of time of exposure controls the level of dosing. In one preferred embodiment, the gaseous vinyl silane monomers are contacted with the surface of the substrate by passing the gaseous vinyl silane monomers over the surface of the substrate at a substantially constant flow rate. Typically, the vinyl silane monomers are delivered to the substrate using conditions and flow rates which are conventionally employed for chemical vapor deposition.

The adsorption of the vinyl silane monomers can be achieved at room temperature (i.e., about 300 K). However, in some embodiments, it may be desirable to employ temperatures above or below room temperature for the adsorption step. In one embodiment of the invention, the step of adsorbing the vinyl silane monomers to the surface of the substrate is carried out at a temperature of not more than about 200 K. In still other embodiments, it may be advantageous to carry out the step of adsorbing the vinyl silane monomers at a temperature of about 300 K or higher. Generally, the temperature at which the adsorption is carried out will not be less than about 80 K or greater than about 600 K. The period of time required to effect the adsorption of the vinyl silane monomers will depend upon the temperature of the adsorption step, and the particular vinyl silane monomer and substrate employed. Generally, the period of time required to achieve the adsorption of the vinyl silane monomers to the surface of the substrate is from about 30 seconds to about 12 hours, and more typically from about 30 seconds to about 2 hours.

The adsorption of the gaseous vinyl silane monomers to the surface of the substrate produces adsorbed vinyl silane monomers which may then be crosslinked to provide the crosslinked carbon-silicon containing polymer film which forms the copper diffusion barrier of the present invention. The adsorbed vinyl silane monomers are crosslinked by exposing the monomers to radiation. The fabrication of the crosslinked carbon-silicon polymer film can be accomplished by exposing a portion of the adsorbed vinyl silane monomers to radiation to thereby cause the crosslinking of the exposed portion of monomers. It is possible to utilize conventional photoresist masking technology to permit the exposure of only a portion of the vinyl silane monomers if desired. According to this embodiment, the step of exposing a portion of the vinyl silane monomers can be carried out by providing a mask over the portion of adsorbed vinyl silane monomers which are not to be exposed to the radiation, so as to provide masked and unmasked regions of adsorbed vinyl silane monomers on the surface of the substrate and irradiating the unmasked regions of adsorbed vinyl silane monomers. The mask may then be removed using conventional techniques. Typically, it is convenient to expose substantially all or all of the vinyl silane monomers to the radiation by irradiating the adsorbed monomers and the substrate. Exposure of the adsorbed vinyl silane monomers to radiation causes crosslinking of the vinyl moieties of the vinyl silane monomers, thereby producing the crosslinked carbon-silicon polymer film.

Any suitable source of radiation can be employed to induce the crosslinking of the adsorbed vinyl silane monomers. Typically, the adsorbed vinyl silane monomers are exposed to radiation selected from the group consisting of ultraviolet radiation, and electron beam radiation. Currently, ultraviolet, and electron beam radiation are preferred for the preparation of the copper diffusion barriers according to the present invention. In one preferred embodiment, the source of radiation is ultraviolet light having a wavelength of 250 nm or less. In another preferred embodiment, the source of radiation is a low energy electron beam of about 1000 eV or less, often about 500 eV.

The step of exposing the adsorbed vinyl silane monomers to radiation may be carried out at room temperatures, or at temperatures above or below room temperature. For example, in one embodiment, the step of exposing the adsorbed vinyl silane monomers is carried out at a temperature not more than 200 K. In another embodiment, this step is carried out at a temperature of about 300 K or higher. In one preferred embodiment, the adsorbed vinyl silane monomers are heated to a temperature of between about 300 K and about 600 K during the step of exposing.

Advantageously, the step of exposing the adsorbed vinyl silane monomers can be carried out at the same temperatures as the step of adsorbing the vinyl silane monomers. Accordingly, in one aspect of the present invention, the vinyl silane monomers are adsorbed to the surface of the substrate at a temperature of at or below 200 K and the step of exposing the adsorbed vinyl silane monomers is also carried out at a temperature of at or below 200 K. Similarly, in another embodiment, the step of adsorbing the vinyl silane monomers to the substrate is carried out at a temperature of 300 K or higher and the step of exposing the adsorbed vinyl silane monomers is also carried out at a temperature of 300 K or higher.

The period of time for exposure of the vinyl silane monomers to the radiation which is required to achieve the crosslinking of the vinyl silane monomers is not critical. Generally, the monomers may be exposed to the radiation for any desired period of time ranging from as short as 1 seconds up to several hours. In most embodiments, the vinyl silane monomers are exposed to radiation for a period of between about 30 seconds and about 1 hr.

Frequently, in the fabrication of electronic and microelectronic components, it is desirable to exclude the presence of water. In the preparation of the crosslinked carbon-silicon polymer films according to the present invention, it is often desirable to exclude the presence of water during the adsorption and exposing steps of the method. Accordingly, the method of producing the crosslinked carbon-silicon polymer film is typically carried out under a vacuum at a base pressure of less than about $10^{-6}$ Torr. The application of a vacuum to exclude the incorporation of water during the fabrication of the crosslinked carbon-silicon polymer film is within the skill of those in the art.

The crosslinked carbon-silicon polymer films produced by the foregoing method are useful without further processing as copper diffusion barriers. However, in some cases, the skilled artisan may desire to carry out the further step of annealing the carbon-silicon polymer film prior to utilizing the film as a copper diffusion barrier. The further step of annealing is preferably carried out under vacuum in order to exclude the incorporation of water and at a temperature of about 650–700 K. Annealing the crosslinked carbon-silicon polymer film is not necessary, but may provide the additional advantage of densification and removal of hydrogen from the film.

The crosslinked carbon-silicon polymer film produced by the foregoing methods has a number of applications in the electronics and microelectronics industry. One particular application of the crosslinked carbon-silicon polymer films is a copper diffusion barrier. The crosslinked carbon-silicon polymer films of the present invention will have a thickness which is sufficient to attenuate the diffusion of copper atoms and copper ions from a copper feature in the device. Typically, the crosslinked polymer film has a thickness of between about 10 nm and about 0.3 nm, often between about 8 nm and about 3 nm, and more often between about 5 nm and about 6 nm. Generally, the diffusion of copper atoms and copper ions from a copper feature increases as the temperature to which the device is exposed increases. The crosslinked carbon-silicon polymer films of the present invention prevent the diffusion of copper atoms and copper ions from the copper feature at temperatures of up to about 750 K. A copper diffusion barrier of about 50–60 Å was found to attenuate Auger electrons from a copper feature.

In use, the copper diffusion barrier is a component of a microelectronic device, and is in substantially direct contact with the copper feature of the device. As previously mentioned, the copper feature may form the substrate on which the copper diffusion barrier of the present invention is produced according to the foregoing methods. Typically the copper diffusion barrier is positioned in the microelectronic device, between the copper feature and a component, such as a polymeric component, which is desirously protected from the diffusion of copper from the copper feature.

Copper diffusion barriers composed of the crosslinked carbon-silicon polymer films of the present invention have a number of advantages. Copper diffusion barriers of the present invention may be tailored to a given need by controlling the silicon content of the polymer film and thereby controlling the properties exhibited by the copper diffusion barrier. Using the methods described above, ultra-thin copper diffusion barriers can be produced which attenuate the diffusion of copper at temperatures as high as 750 K. In addition, the copper diffusion barriers of the present invention can be produced using conventional microelectronic equipment in only a few steps.

B. Polymer Films for Various Applications

In addition to the copper diffusion barriers discussed above, the present invention also provides hydrocarbon or halogenated hydrocarbon polymer films which have a variety of applications in electronic and microelectronic devices. According to the present invention polymer films covalently bound to a substrate can be produced by the method which generally involves the steps of a) adsorbing a plurality of vinyl silane monomers on a substrate, b) contacting the adsorbed vinyl silane monomers with gaseous polymerizable monomers; and c) polymerizing the polymerizable monomers on the adsorbed vinyl silane monomers to produce the polymer film. The polymer film is covalently bound to the substrate through the vinyl silane monomers. The polymer film may be produced on any of the substrates described above.

The step of adsorbing the vinyl silane monomers to the substrate is carried out using the vinyl silane monomers, and the techniques and conditions described above for the production of copper diffusion barriers. The polymer film is produced on the adsorbed vinyl silane monomers by polymerizing the polymerizable monomers which will produce the polymer film on the vinyl silane monomers.

The polymerizable monomers which can be employed in the methods of the present invention to produce polymer films on a substrate generally include monomers which are capable of bonding to the vinyl moiety of the adsorbed vinyl silane monomers and are also capable of crosslinking with other polymerizable monomers upon exposure to radiation. More specifically, the polymerizable monomers employed in the present invention include but are not limited to unsaturated hydrocarbon monomers, and unsaturated halo-substituted hydrocarbon monomers. Examples of suitable polymerizable monomers will be readily determinable by those skilled in the art based upon the definitions provided above, and include, for example, ethylene, acetylene, benzene, perfluoroethylene, perfluorobenzene, butadiene, perfluorobutadiene, parylene, perfluoroparylene, and the like.

In addition to the unsaturated hydrocarbon monomers, it is also possible to utilize saturated hydrocarbon monomers such as linear or branched alkanes, as the polymerizable monomers in the methods of the present invention. Examples of suitable saturated hydrocarbon polymerizable monomers include but are not limited to ethane, propane, isopropane, butane, as well as halo-substituted alkanes, and the like. Currently, the unsaturated hydrocarbon monomers and unsaturated halo-substituted hydrocarbon monomers are preferred.

Combinations of two or more polymerizable monomers may be utilized for the preparation of desired copolymer films. For example the polymerizable monomers utilized in methods of the present invention may be a combination of an unsaturated hydrocarbon monomer (e.g., ethylene) and an unsaturated halo-substituted hydrocarbon monomer (e.g., perfluorobenzene). It is also possible for the polymerizable monomer to be a mixture of two or more unsaturated hydrocarbon monomers or two or more unsaturated halo-substituted hydrocarbon monomers. Mixtures including a saturated hydrocarbon monomer with either or both of the unsaturated hydrocarbon monomers and unsaturated halo-substituted hydrocarbon monomers may also be employed. One preferred combination of polymerizable monomers includes a mixture of ethylene and perfluorobenzene for the preparation of a copolymer film. When a combination of two or more polymerizable monomers are employed in the methods of the present invention, the step of polymerizing the monomers comprises copolymerizing the polymerizable monomers to produce a copolymer film.

The step of contacting the polymerizable monomers with the adsorbed vinyl silane monomers can be carried out by any suitable means known to those skilled in the art, including the method described above for contacting the vinyl silane monomers to the substrate. In other example, the polymerizable monomers are contacted with the adsorbed vinyl silane monomers comprises passing gaseous polymerizable monomers, i.e., polymerizable monomers in the gas phase, over the adsorbed vinyl silane monomers on the substrate in the presence of ionizing radiation. This is typically done under industrial conditions using an indirect plasma reactor. Typically, the gaseous polymerizable monomers are contacted with the substrate having the vinyl silane monomers adsorbed thereto under conditions sufficient to allow the bonding of the polymerizable monomers to the adsorbed vinyl silane monomer and polymerization of the polymerizable monomers when the polymerizable monomers and adsorbed vinyl silane monomers are exposed to radiation. The same techniques used for contacting the vinyl silane monomers to the substrate can be employed for contacting the gaseous polymerizable monomers with the adsorbed vinyl silane monomers. In one preferred embodiment, the gaseous polymerizable monomers are contacted with the adsorbed vinyl silane monomers by passing the gaseous polymerizable monomers over the substrate having the vinyl silane monomers adsorbed thereto at a substantially constant flow rate. The optimal flow rate for a particular application will depend upon the particular polymerizable monomer(s) selected and the desired thickness of the resulting polymer film as will be appreciated by those skilled in the art. Conventional chemical vapor deposition technology skills can be employed to determine the proper flow rate for a given application. The gaseous polymerizable monomers either react with the radiation, forming free radicals which react with the vinyl silane, or cause molecules to react eith vinyl silane radicals.

The contacting step -may be carried out at room temperature (i.e., about 300 K). Advantageously, it is also possible to carry out the contacting step at the same temperatures as the step of adsorbing the vinyl silane monomers. In other words, the step of contacting the polymerizable monomers to the adsorbed vinyl silane monomers can be carried out at elevated temperatures in excess of 300 K, or at lowered temperatures of below about 300 K. Generally, the temperature at which the contacting step is carried out will not be less than about 200 K or greater than about 600 K.

Once in contact with the adsorbed vinyl silane monomers, the polymerizable monomers are polymerized to produce the polymer film. The step of polymerizing the polymerizable monomers is carried out by exposing the polymerizable monomers to radiation. The exposure of the polymerizable monomers to radiation can be carried out by irradiating the gaseous stream of polymerizable monomers. In other words, the step of contacting the polymerizable monomers and the step of polymerizing the monomers can be carried out substantially simultaneously if desired. However, it is not essential to expose the polymerizable monomers to radiation simultaneously with contacting the polymerizable monomers with the adsorbed vinyl silane monomers on the substrate.

Any suitable source of radiation discussed above for the crosslinking of the vinyl silane monomers can be employed for the polymerization of the polymerizable monomers as well. Currently, ultraviolet, and electron beam radiation are preferred for the preparation of the polymer films according to the present invention. In one preferred embodiment, the source of radiation is ultraviolet light having a wavelength of 250 nm. In another preferred embodiment, the source of radiation is a low energy electron beam of about 1000 eV or less.

The step of exposing the polymerizable monomers to radiation may be carried out at room temperatures, or at temperatures above or below room temperature. For example, in one embodiment, the step of exposing the polymerizable monomers is carried out at a temperature not more than 200 K. In another embodiment, this step is carried out at a temperature of about 300 K or higher, but typically less than about 600 K. In one preferred embodiment, the polymerizable monomers are exposed to radiation at a temperature of between about 300 K and about 600 K during the step of exposing the monomers to radiation. In another preferred embodiment, the step of polymerizing the polymerizable monomers is carried out at a temperature of about 100 K.

The period of time of exposure of the polymerizable monomers to the radiation to achieve the free radical polymerization is not critical. Generally, the monomers may be exposed to the radiation for any desired period of time ranging from as short as 1 second up to several hours. In most embodiments, the polymerizable monomers are exposed to radiation for a period of between about 1 second and about 2 hrs.

As in the case of the preparation of copper diffusion barriers described above, it may be desirable to exclude the incorporation of water into the polymer film during the process of producing the film. The exclusion of water can be accomplished by carrying out the foregoing methods under vacuum, such as for example a vacuum at a base pressure of less than about $10^{-6}$ Torr. The application of a vacuum to exclude the incorporation of water during the fabrication of the polymer film is within the skill of those in the art.

Exposure of the polymerizable monomers to radiation causes the bonding of the polymerizable monomers to the adsorbed vinyl silane monomers and the polymerization of the polymerizable monomers. The resulting polymer film is covalently bound to the substrate via the vinyl silane monomers. Typically, the polymerizable monomers are polymerized by free radical polymerization upon exposure to the source of radiation.

The thickness of the polymer films can be varied by, for example, controlling and adjusting the flow rate of polymerizable monomers during the contacting and exposing steps of the method. Polymer films as thin as about 1 atomic layer, or about 0.5 nm, can be produced by optimizing the reaction conditions to control the polymer growth pattern. Polymers of unlimited thickness may be obtained by supplying sufficient monomer necessary to achieve the desired thickness. In other words, the thickness of the polymer film may be built up by irradiating a continuous supply of polymerizable monomers. Once the desired polymer film thickness is achieved, the polymerization can be terminated by stopping the flow of polymerizable monomers. Typically, polymer films having a thickness of between about 1 nm and about 1000 nm will have significant applications in the microelectronics industry. Naturally, thicker polymer films may be desirable in any number of applications, even those outside of the field of microelectronics, and may conveniently be produced by the methods of the present invention. Thicker polymer films may also be provided by contacting polymerizable monomers with the adsorbed vinyl silane groups, exposing the monomers to radiation, contacting the polymerized monomers with additional polymerizable monomers and exposing the polymerizable monomers to radiation to induce the further polymerization of the polymerizable monomers with the previously polymerized monomers.

The polymer film produced by the foregoing methods has a number of applications in the electronics and microelectronics industries. One particular application of the polymer films is a dielectric insulating layer in, for example, the metallization of silicon semiconductor devices. Another application of the polymer films of the present invention is a corrosion barrier for use in aqueous or humid environments. Yet another possible application of the polymer films is a lubricating layer for nanomachining applications. The polymer films of the instant invention may also be used to modify the surface properties of highly porous xerogel materials, for example to make the surface hydrophobic or hydrophilic, or by sealing the surface of a porous material.

In use, the polymer film of the present invention is a component of a microelectronic device, and is covalently bound to the substrate.

The methods of the present invention for producing polymer films have a number of distinct advantages over conventional film-forming methods. The method of the instant invention is capable of providing polymer films of varying thicknesses, thereby accommodating a wide variety of applications. Ultra-thin polymer films (i.e., less than 10 nm in thickness), such as those required for some microelectronic device applications, can be produced with efficiency. The properties of a film can be controlled by the use of comonomers during the polymerization step to produce copolymers. In addition, the polymer films of the present invention can be produced using conventional microelectronic processing equipment in only a few steps.

The following examples are provided to illustrate the present invention, and should not be construed as limiting thereof. In these examples, "cm" means centimeters, "mm" means millimeters, "N" means normal, "Ta" means tantalum, "K" means temperature in Kelvin, "eV" means electron volts, "keV" means kilo electron volts, and "s" means seconds.

EXAMPLE 1

Experiments were performed in a turbomolecularly pumped stainless steel ultrahigh vacuum (UHV) system equipped for Auger measurement and temperature programmed desorption studies. The base pressure after bake-out was $2\times10^{-10}$ Torr. The sample was a 10×10×0.25 mm polycrystalline Cu foil with 5N purity purchased from ESPI. It was mounted on a Ta sample holder spot welded to two Ta leads. The sample temperature was varied continually between 80 and 1000 K by a combination of resistive heating and liquid-nitrogen cooling. Sample temperature was monitored by a chromal-alumel thermocouple spot-welded between the two sheets to the Ta holder. The sample was cleaned by repeated cycles of argon ion sputtering and annealing to 750 K. Sample cleanliness was determined by Auger Electron Spectroscopy (AES).

Auger spectra were obtained at 3 keV excitation energies, and recorded in the differential mode using a commercial cylindrical mirror analyzer, lock-in amplifier and a x-y recorder. TPD spectra were recorded with a linear heating rate of 10±2 K/s using a computer-controlled quadrupole mass analyzer. The quadrupole was equipped with a gold-plated shroud with a collimated opening for line-of-sight measurements. The spectrometer was interfaced to a computer to allow recording of up to ten different amu settings during a single run.

Trichlorovinylsilane (97%) was purchased from Aldrich and was used without further purification. Before introduced into the chamber, the trichlorovinylsilane underwent repeated freeze-pump-thaw cycles to ensure sufficient degassing. Gas exposures were carried out using separate stainless steel directional dosers and manually operated leak valves. Exposures (Langmuir; L) are reported here in terms of time and chamber background pressure ($1L=10^{-6}$ Torrxs). Chamber pressure was monitored by a nude ion gauge calibrated for dinitrogen. Exposures have not been corrected for ion gauge sensitivity or flux to the sample.

Electron-beam induced polymerization was performed by electron bombardment of the vinyl silane dosed sample with the Auger electron source. The sample was placed approximately 2 cm away from the electron gun. The excitation was carried out at 500 eV and the excitation time was divided equally among the sample center and the four corners. After the electron-beam treatment, the sample was annealed to 700/850 K. Auger peak-to-peak ratio (after the relative sensitivity correction) indicated that the chemical composition of the former polymer was Si:Cl:C≈1:3:2.

Similar experiments were carried out using trimethylvinylsilane (97% purity from Aldrich) on polycrystalline Al foil (10×10×0.13 mm, 99.9995% purity from Alfa Aesar). The Al sample was spot welded on a Ta sample holder and the thermocouple junction was spot welded between the two sheets to the Al. Trimethylvinylsilane vapor was dosed directionally on the Al at 80 K. After the electron-beam treatment (500 eV at 80 K), the sample was annealed to 700 K. Auger spectra showed that the Al substrate signal was completely annenuated by the formed polymer film. Auger peak-to-peak ratio (after the relative sensitivity correction) indicated that the chemical composition of the film was Si:C≈1:4.

EXAMPLE 2

The adsorption of the vinyl silane monomers is achieved by introducing the vapor of vinyl silane monomer into a vacuum chamber through a manually operated leak valve and a stainless steel directional doser. The substrate is typically cooled to 80 K and placed directly in front of the doser. Dosage is performed by holding the chamber pressure constant and varying the dosing time. Gas exposure is calculated in terms of time and pressure (1 Langmuir=$10^{-6}$ Torr×second). It is not corrected for ion gauge sensitivity or flux to the sample. The dosing pressure is normally $10^{-9}$ Torr and dosing time 100 seconds. After the adsorption of the vinyl silane monomers, the substrate is placed in front of the electron beam source to promote crosslinking of the adsorbed vinyl silane monomers. The excitation is carried out at 500 eV and the excitation time is generally 10 minutes. Meanwhile, the sample temperature is kept at 80 K. After the electron-beam treatment, the substrate is annealed to 700–850 K depending on the substrate.

The foregoing examples are illustrative of the present invention and are not to be construed as limiting thereof. The invention is defined by the following claims, with equivalents of the claims to be included therein.

That which is claimed is:

1. A copper diffusion barrier for a microelectronic device having a copper feature, said copper diffusion barrier comprising crosslinked carbon-silicon polymer film having a thickness sufficient to attenuate the diffusion of copper atoms and copper ions from said copper feature.

2. The copper diffusion barrier according to claim 1, wherein said crosslinked carbon-silicon polymer film is on a substrate selected from the group consisting of copper substrates, silicon substrates, silica substrates, aluminum substrates, alumina substrates, tungsten substrates, tantalum substrates, titanium nitride substrates, tantalum nitride substrates, and titanium tungsten alloy substrates.

3. The copper diffusion barrier according to claim 1, wherein said copper diffusion barrier prevents the diffusion of copper atoms and copper ions therethrough at temperatures of up to about 750 K.

4. The copper diffusion barrier according to claim 1, wherein said carbon-silicon polymer film has a thickness of not more than about 10 nm.

5. The copper diffusion barrier according to claim 1, wherein said carbon-silicon polymer film is produced by a process comprising the steps of:

a) adsorbing a plurality of vinyl silane monomers on a substrate to provide adsorbed vinyl silane monomers, and b) exposing at least a portion of said adsorbed vinyl silane monomers to radiation, whereby said plurality of vinyl silane monomers are crosslinked to provide said crosslinked carbon-silicon polymer film copper diffusion barrier.

6. The copper diffusion barrier according to claim 5, wherein said step (b) of exposing comprises irradiating at least a portion of said adsorbed vinyl silane monomers with radiation selected from the group consisting of heat, ultraviolet radiation, and electron beam radiation.

7. The copper diffusion barrier according to claim 5, wherein said step (a) of adsorbing comprises contacting gaseous vinyl silane monomers to said substrate at a temperature of not more than about 200 K for a period of time sufficient for said vinyl silane groups to adsorb on said substrate, and said step (b) of exposing comprises irradiating at least a portion of said adsorbed vinyl silane monomers with radiation selected from the group consisting of ultraviolet and electron beam radiation, at a temperature of not more than about 200 K.

8. The copper diffusion barrier according to claim 5, wherein said step (a) of adsorbing comprises contacting gaseous vinyl silane monomers to said substrate at a temperature of not less than about 300 K for a period of time sufficient for said vinyl silane groups to adsorb on said substrate and (b) of exposing comprises irradiating at least a portion of said adsorbed vinyl silane monomers with radiation selected from the group consisting of ultraviolet and electron beam radiation, at a temperature of not less than about 300 K.

9. The copper diffusion barrier according to claim 5, wherein said copper diffusion barrier is produced by a method which further includes the step (c) of annealing the crosslinked carbon-silicon polymer film at a temperature of about 700 K.

10. The copper diffusion barrier according to claim 1, wherein said crosslinked carbon-silicon polymer film is formed by crosslinking adsorbed vinyl silane monomers having the formula $$RSiX_3$$

wherein: R is selected from the group consisting of unsaturated $C_1$–$C_8$ hydrocarbyl radicals and unsaturated halo-substituted $C_1$–$C_8$ hydrocarbyl radicals; and X is selected from the group consisting of H, halo, $C_1$–$C_8$ alkyl, and $C_1$–$C_8$ alkoxyl.

11. A microelectronic device comprising a copper feature and a copper diffusion barrier on a substrate, said copper diffusion barrier comprising a crosslinked carbon-silicon polymer film, wherein said copper diffusion barrier prevents the diffusion of copper atoms and copper ions from said copper feature at temperatures of up to about 750 K.

* * * * *